United States Patent [19]

Gunther et al.

[11] Patent Number: 5,748,638
[45] Date of Patent: May 5, 1998

[54] METHOD FOR STORING SECURITY RELEVANT DATA

[75] Inventors: Stephan Gunther; Christoph Kunde, both of Berlin, Germany

[73] Assignee: Francotyp-Postalia Aktiengesellschaft & Co., Birkenwerder, Germany

[21] Appl. No.: 192,839

[22] Filed: Feb. 7, 1994

[30] Foreign Application Priority Data

Mar. 11, 1993 [EP] European Pat. Off. ............ 93103951

[51] Int. Cl.⁶ .................................................. G11C 29/00
[52] U.S. Cl. .................................... 371/21.2; 371/21
[58] Field of Search ................................ 371/21.1, 21.2, 371/36.1, 68.1, 67.1, 20

[56] References Cited

U.S. PATENT DOCUMENTS

| | | | |
|---|---|---|---|
| 3,596,254 | 7/1971 | Highleyman | 340/172.5 |
| 3,681,578 | 8/1972 | Stevens | 371/36 |
| 4,799,140 | 1/1989 | Dietz et al. | 371/36 |
| 4,802,117 | 1/1989 | Chrosny et al. | 364/900 |
| 4,805,109 | 2/1989 | Kroll et al. | 364/464.02 |
| 4,817,004 | 3/1989 | Kroll et al. | 364/464.02 |
| 4,845,632 | 7/1989 | Kroll et al. | 364/464.02 |
| 5,128,875 | 7/1992 | Abumehdi et al. | 364/464.02 |
| 5,191,610 | 3/1993 | Hill et al. | 380/21 |
| 5,220,567 | 6/1993 | Dooley et al. | 371/5.1 |

FOREIGN PATENT DOCUMENTS 0376486  7/1990  European Pat. Off. ......... G06F 11/20

*Primary Examiner*—Phung M. Chung
*Attorney, Agent, or Firm*—McCormick, Paulding & Huber

[57] ABSTRACT

In a method for storing security relevant data in a postage meter the same data (A, B, C, D) are stored in at least four memory areas (a, b, c, d). The data (A, B, C, D) of each memory area (a, b, c, d) are compared with the data (A, B, C, D) of other memory areas (a, b, c, d). In dependence on these comparisons (V1 to V6) the memory area or memory areas (a, b, c, d) having faulty data (A, B, C, D) are ascertained and if suitable are reloaded with data (A, B, C, D) from a memory area (a, b, c, d) with fault free data. The method operates at small expense and can correct the ascertained data faults.

20 Claims, 10 Drawing Sheets

METHOD FOR STORING SECURITY RELEVANT DATA

FIELD OF THE INVENTION

The invention concerns a method for storing security relevant data in a postage meter, in which the same data is stored in several memory areas, the data is read out of the memory areas, and the data of one memory area is compared with the data of another memory area; and by means of which method memory areas having faulty data are ascertained.

BACKGROUND OF THE INVENTION

Such a method increases the security of data in a postage meter, since the appearance of faulty data can be detected and indicated. Such methods have special significance in the storing of security relevant data, such as the postage values in postage meters, which must be protected from unintended manipulation. For example, in the memory of a postage meter the remaining amount of postage is stored, which gives the not yet used postage value and which is reduced during each postage issuing procedure. Further, the used amount of postage is also stored, that is the sum of the postage value printed during the postage issuing procedures. Moreover, a control value is also stored which gives the amount of postage value used during the life of the postage meter.

In known methods the same security relevant data is stored several times. For the examination of the data for faults these data are loaded and are compared with corresponding data from the other memory areas. Through the comparison it can indeed be ascertained whether a data fault is present, yet the data fault itself cannot be removed, that is the data cannot be corrected. The postage meter therefore upon the appearance of a data fault must be taken out of operation which can lead to considerable economic disadvantages. One such operational incident involves substantial cost.

A method for the storage of data is further known in which defective memory elements, which can be the origin of data errors, are marked. Upon the storage of new data the marked memory elements are avoided. This method assumes that the defective memory elements can be recognized reliably and that the data faults do not appear sporadically, as for example can be the case with data faults which are evoked by spontaneous radioactive decay in an electrical memory.

A method for the storage of security relevant data in a postage meter is described in EP 0 188 382 B1, in which the summed value of the used postage is compared with a predetermined test value. If the two values are different, a fault signal is output to indicate a data fault.

Another storage method is known from EP 0 226 205 B1 in which the data of a first storage area is stored in similar manner in a second storage area. If a serious fault or a hardware error appears in the first storage area, then the data of the second storage area is written into a previously reserved further storage area, which takes over the function of the first storage area.

SUMMARY OF THE INVENTION

The object of the invention is to provide a method for the storage of security relevant data in a postage meter by means of which with small expense faulty data can be reliably detected and with which given types of faults in the fault containing data can be corrected.

This object is solved for a method of the previously described kind in that the same data is stored in at least four memory areas, the data of each memory area is compared with the data of other memory areas, and depending on these comparisons the one or more memory areas with faulty data are ascertained and may be reloaded with non-fault containing data from one memory area.

In accordance with the invention the same data is stored in at least four memory areas. These memory areas can be portions of a single memory or can be contained in different memories electronically separate from one another. Preferably, the memory areas are contained in separate electronic memories which as much as possible are supplied with current independently of one another and/or use different memory principals. Thereby the probability of several memories failing at the same time, and causing a data loss, is reduced.

In the invention the faulty datum or data in one or more memory areas is not itself ascertained, but instead the data areas containing the faulty datum or data are ascertained. In connection with this the data in each memory area is compared with the data in other memory areas. If, for example, the data is stored in four memory areas, each of these four memory areas can be compared with the remaining three other memory areas. This means, in this example, that six comparisons of the memory contents with one another are carried out. The comparisons can be carried out byte wise in bit alignment by use of an exclusive OR logic circuit. Since it makes no difference whether only one bit of one memory location of a memory area or whether all of the binary data of a memory area is faulty, the comparison can be carried out very quickly with the help of known comparison algorithms. The high speed of the comparisons is based on the fact the faulty data need not themselves be identified.

Through the invention, in the case of a given data fault type the memory area with fault containing data is ascertained and is loaded with new fault free data. This will be briefly explained in connection with an example: Assume that of four memory areas two contain fault free data and two others contain faulty data. In the six comparisons of the data of the memory areas with one another in five of them it is found that the data fails to agree with one another, and only in the two memory areas with fault free data the data agree entirely with one another. In this simple case the fault free memory areas can be recognized in simple ways. The faulty data in the other memory areas are then written over by fault free data from the accurate memory areas. In this way, after the carrying out of the method all four memory areas are filled with fault free data, without the fault containing data having been exactly identified.

In a preferred embodiment of the invention in at least two memory areas the data is stored in inverted form, so that upon comparison with non-inverted data the inverted data is negated. A highly common data fault is based on the fact that the current supply for the physical memory or memories, which contain one or more of the memory areas, fails and all of the data of these memory areas or memory area has the value 0 or 1. In such a case upon the different comparisons of the data of these memory areas agreement will be ascertained, even though a grave data fault is present. By the measures of this improvement such a situation is inhibited.

In another form of the invention the comparison of the data takes place through an exclusive OR logic circuit with the comparison preferably being carried out byte wise with bit alignment. In this type of circuit upon agreement of the data the binary result with positive logic is "0" and with negative logic is "1". This circuit allows very rapid execution, so that for the comparisons little time is required. Moreover, the exclusive OR circuit has the advantage that the result is independent of whether non-inverted or inverted data are being compared with one another.

A preferred development of the invention is characterized in that a fault number is produced which gives the number of comparisons in which a lack of agreement of the data of the memory areas has been determined, and that the data faults are removed in dependence on the fault number. By means of these measures the kind of fault can be determined from the fault number. Since for different fault types different routines are used for removing the faults, in the space of a software routine branching can be made to program portions dependent on the fault number, which program portions effect a fault analysis, a fault removal or a fault indication. Thereby a simple and yet efficient fault analysis is carried out and measures for the removal of the faults are introduced.

According to another development of the invention before or upon the storing of the data in the memory areas from the data of each memory area a first test sum is formed and stored. Upon the reading out of the data, or thereafter, through the data of each memory area a second test sum is ascertained, which is compared with the first test sum. If a fault is determined this is removed in dependence on the comparison of the test sums. The test sums can be produced in accordance with a known type of parity method. In that case the data are arranged in a matrix and from the row data and/or column data test bits are ascertained which are arranged into a data word and used as a test sum. Since the test sums upon the first storage of the data and upon the later reading out of the data are formed in the same way, a data fault is also noticeable from the proof sums. By a proof sum comparison the memory area with fault containing data can be located and therefore measures for eliminating the fault can be undertaken.

An example, in which the same data is stored in four memory areas, will make this clear. It is assumed that in the six comparisons of the data of each memory area with the data of the other memory areas three comparisons with lack of agreement of the data are found. This can mean that one of the four memory areas contains a defective datum and that the other three memory areas contain fault free data. Three comparisons in which data faults exist is also a possibility if the data of only a single memory area is fault free with the other three memory areas each having the same fault, for example because of a voltage failure containing only data "0" or "1". Therefore, different types of fault can be indicated by the same fault number. This fault number therefore delivers no criterium for differentiating these fault types and for introducing further measures for fault removal. However, in this example by means of a test sum comparison it can be determined whether only one memory area contains defective data or whether three memory areas contain faulty data.

Another exemplary embodiment of the invention is characterized in that in the case of the fault number being 6, for each memory area a test sum comparison is carried out, and in the case of negative results for all test sum comparisons a fault signal is created which indicates that the fault cannot be corrected. This situation is present if in all four memory areas the data are faulty, with the faults being different from one another. In this case no memory area is available whose data can be used for restoring the other memory areas. Therefore in this example an indication is made that a loss of data has occurred which cannot be corrected with the measures described herein.

It can further be provided that over a given period of time for each memory area the faults which appear are ascertained and indicated. Therefore it is possible, on the basis of the frequency of the data faults, to decide that a defect is present in the hardware and/or software used for that memory. The corresponding memory area or physical memory unit can therefore be identified by means of a fault analysis and if suitable to do so can be replaced.

In a further embodiment it is provided that the above described method is automatically carried out at pregiven time intervals. Thereby events which evoke data faults and which are not associated with the memory procedure, for example data faults caused by spontaneous radioactive decay, can be reliably recognized and if need be can be removed. Moreover, it is also possible to carry out the above described methods in dependence on an external event. One such event can for example be the calling up of a test routine by an operator. Thereby the supervision of the postage meter with regard to data security is supported and the diagnosis of faults is simplified.

BRIEF DESCRIPTION OF THE TABLES AND DRAWINGS

Exemplary embodiments of the invention are described in the following in connection with the accompanying tables and drawings which show:

Tables 1,2,3,4,5 and 6 are tables showing different types of faults and their characteristic comparison results.

FIG. 1 is a schematic representation of the arrangement of four memory areas in two electronic memories independent of one another.

FIGS. 2a, 2b, 2c, 2d, and 2e taken together show a flow diagram illustrating the steps of the method for storing security relevant data and for the correction of data faults.

Figure 4:
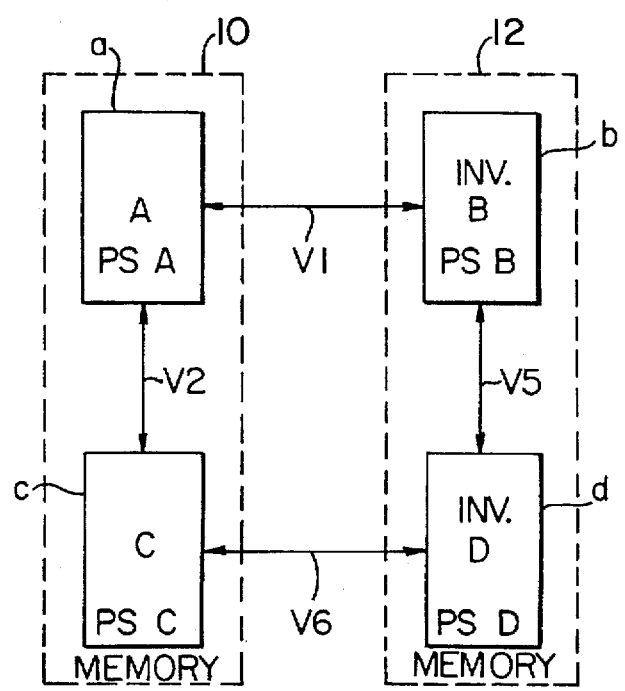
FIG. 4 is a schematic illustration of an arrangement according to FIG. 1 in which only four data comparisons are carried out.
Figure 5A:
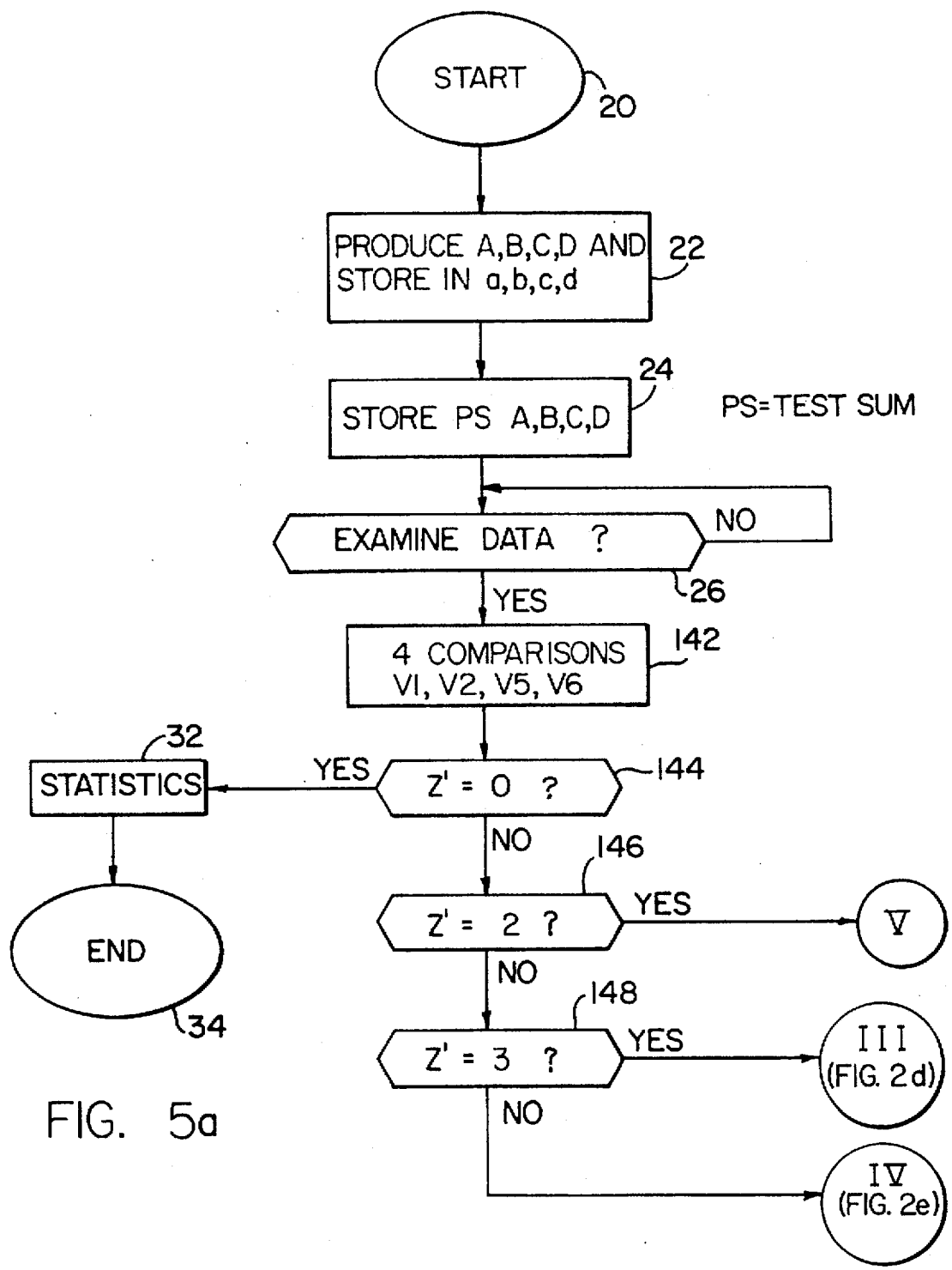
Figure 5B:
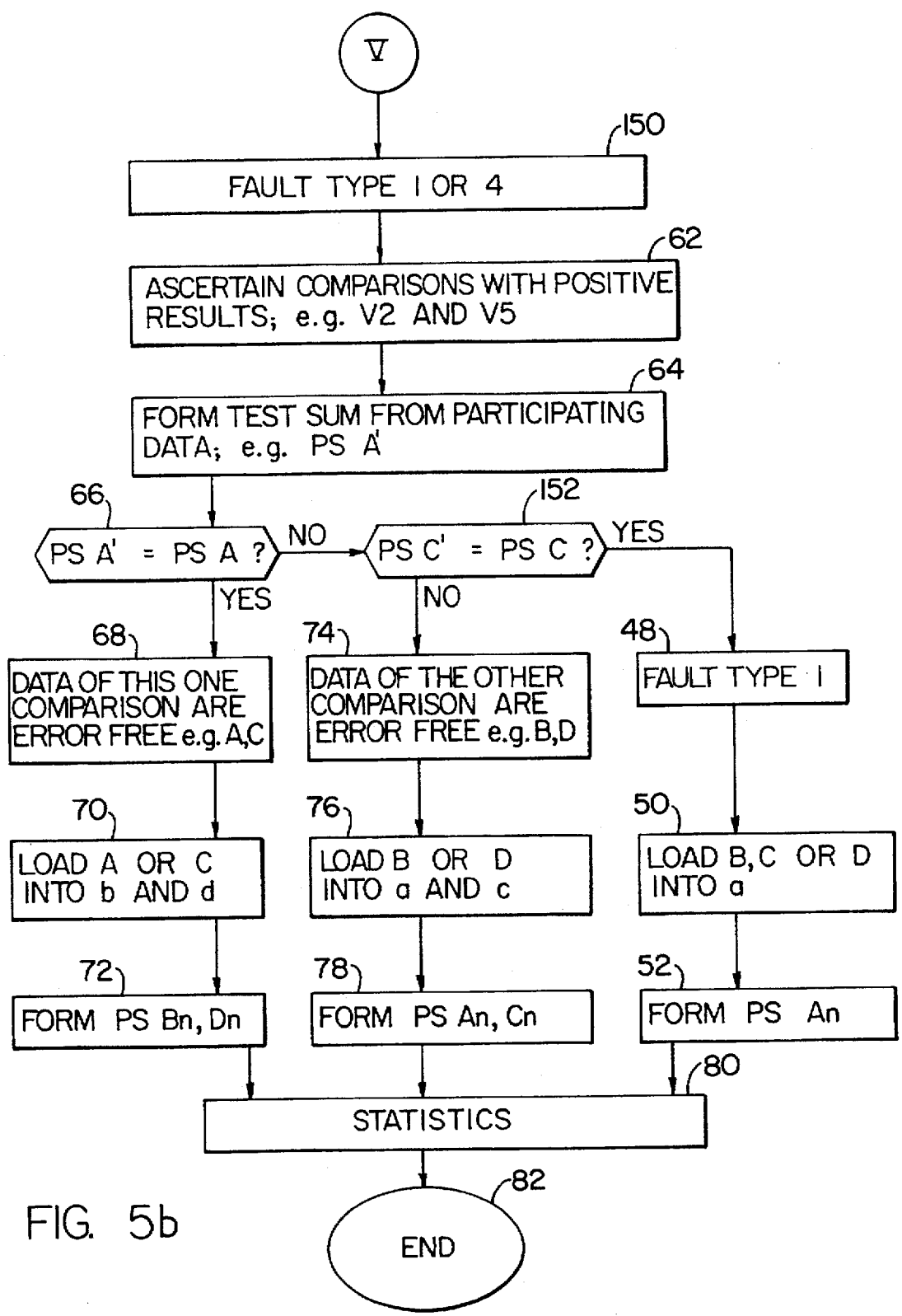

FIGS. 5a and 5b in combination illustrate a flow diagram of an exemplary embodiment with an arrangement according to FIG. 4 in which fault types 1 and 3 to 6 are handled.

DETAILED DESCRIPTION OF THE PREFERRED EMBODIMENTS

Figure 1:
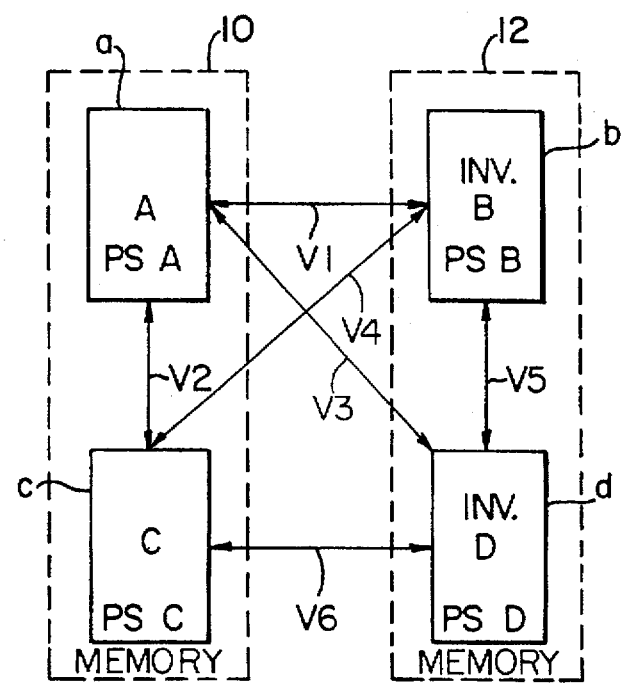

In FIG. 1 a first electronic memory 10 has two memory areas a and c, in which the same security relevant data A and C are stored in a postage meter. A second electronic memory 12, which is physically separate from the memory 10 and which has a separate current supply, contains two memory areas b and d, in which likewise the same security relevant data B and D are stored in inverted form. From each of the data A to D a first test sum PSA, PSB, PSC and PSD is formed and stored in the associated memory area a to d. As yet to be explained, these test sums PSA to PSD are used for the identification of memory areas a to d containing faults.

In the presently described embodiment the data of each memory area is compared with the data of each of the other memory areas. This means that six comparisons V1 to V6 are carried out, as indicated by the arrows in FIG. 1. By means of these comparisons in a fast test procedure involving the direct comparison of the data A to D with one another it is determined whether the data (for example A) of one or more of the memory areas a to d differs or not from the other data (for example data B to D). In the case of a difference it is not established whether several data or a definite datum is faulty. The time and computer usage required for this is too large. Since such a detailed analysis is forgone, it is possible to carry out comparisons in little time with simple software routines. For example, the comparisons of the data A to D with one another can be made by means of exclusive OR logic circuits.

For the comparison of the same types of data with one another, that is inverted or non-invented data, these need not be converted. If however dissimilar types of data are to be compared with one another a batch of the data is negated in advance of the execution of the exclusive OR procedure. Another possibility exists in that the comparison is carried out without changing the data and instead inverting the result of the exclusive OR procedure.

Tables 1 to 6 give examples of the different types of faults 1 to 6 which are recognizable in accordance with the method of the invention. In Table 1 fault type 1 is dealt with. In the case of this type of fault one memory area has a data error, that is one datum or several data among all the data in the associated memory area is faulty. The data in the other memory areas are at the same time error free. In Table 1 it is taken by way of example that the data A in memory area a are faulty, while the data B, C, D in memory areas b, c, d have no data errors. In accordance with the exemplary embodiment of the invention six comparisons V1 to V6 of the data A to D with one another are carried out, as a result of which it is shown that three comparisons V1, V2, V3 show lack of agreement of the data. In the example here chosen the data A takes part in those comparisons having lack of agreement. A fault number Z is produced, which indicates how often disagreements of the data A to D of the memory areas A to D are determined in the comparisons V1 to V6. In the illustrated case the fault number Z has the value 3. Also, a fault number Z' is produced which relates to the comparisons V1, V2, V5 and V6 and is evaluated in a later still to be described exemplary embodiment.

In Table 2 an example is given of fault type 2. In the case of this fault type the data, for example data A, are error free while the data B, C, D contain faults, with each having the same fault. For example, it can be that the data B, C, D because of a hardware error have the same value "0". The comparison results V1 to V6 in the comparisons of the data A to D show no agreement in the case of the three comparisons V1, V2, V3. Accordingly the error number Z has the value 3, as also in the previous example of fault type 1.

An example of fault type 3 is illustrated in Table 3. In the case of this fault type the data of a single memory area is faultless, for example the data A, while the data of the other memory areas, for example the data B, C, D contain faults with different data errors being present. From Table 3 it is to be seen that the comparison results of the comparisons V1 to V6 is that the fault number Z has the value 6.

Table 4 gives an example of fault type 4. This fault type 4 concerns two memory areas whose data has the same error. In Table 4 it is by way of example taken that the data A, C in the memory areas a, c have the same errors. The data B and D in the memory areas b, d are faultless. As given by Table 4 the six comparisons V1 to V6 lead to the result that four comparisons V1, V3, V4 and V6 show lack of agreement. The fault number Z therefore has the value 4.

Fault type 5 is involved in Table 4, in which the data in two memory areas are faulty and have different errors. The data in the other memory areas are fault free. In Table 5 it is assumed that the data A, C are faulty and that the data B, D are fault free. The comparisons V1 to V6 of the data A to D with one another leads to the result, that in the case of five comparisons V1 to V4 and V6 a lack of agreement of the data of memory areas a to d is present. The fault number Z therefore has the value 5.

Finally, fault type 6 is treated in Table 6, in which case the data A to D in the four memory areas a to d have different faults. In this case no comparison V1 to V6 shows an agreement of data. The fault number Z therefore has the value 6.

The method steps of the exemplary embodiment with four memory areas a, b, c, d and associated data A, B, C, D is illustrated by a flow diagram in FIG. 2a to 2e. In this exemplary embodiment the fault types 1 to 6 represented in Tables 1 to 6 are recognized and suitable measures for the elimination of the faults or for indicating the faults are effected. According to FIG. 2a, after the start in method step 20 the security relative similar data A, B, C, D are produced and stored (step 22) in the memory areas a, b, c, d. In step 24 from the data A to D first test sums PSA to PSD are formed and stored, preferably in the associated memory areas a to d. The creation of the test sums PSA to PSD can take place before or with the storing of the data A to D.

In method step 26 a test is made of whether a data examination is to be carried out. Such a test can be carried out automatically at pregiven time intervals or in dependence on an external event, for example in the background of a function test. If a data examination is to be carried out, in method step 28 the data A to D is loaded and the data of each memory area a to d is compared with the data of the other memory areas a to d. Therefore, with four memory areas the comparisons V1 to V6 shown in Tables 1 to 6 are executed. With these comparisons V1 to V6 a fault number Z is obtained, which indicates how often a lack of agreement of the data A to D of the memory areas a to d occurs. If in step 30 it is determined that no agreement failure is present, that is Z=0, in the following step 32 this result is evaluated for statistical purposes and the program in which the individual method steps are stored is exited in step 34.

In the event it is determined in step 36 that the fault number is Z=3, a branch is made to program Section I. If the fault number has the value Z=4, in step 38 a branching is made to program Section II. With a fault number of Z=5 a shift is made in step 40 to program Section III, and in other cases to program Section IV.

In the following description of program Sections I to IV by way of example data faults are considered which agree with those of Tables 1 to 6. In the case of program Section I, as shown in FIG. 2b, in step 42 it is determined that the data A took part each time in the comparisons which showed a lack of agreement of the data. In the following method step 44 a second test sum PSA' is formed from the actual data A. In method step 46 a test is then made as to whether the second test sum PSA' agrees with the first test sum PSA. If there is no agreement, fault type 1 is present and is determined in method step 48. In the chosen example (see Table 1) the data B, C and D are fault free. To correct the data in memory area a, in method step 50 the data B, C or D is loaded into the memory area a, which thereafter contains corrected new data An. In method step 52 a test sum PSAn is formed which in subsequent data examinations is used as the first test sum PSA.

Thereupon the procedure advances to method step 54 in which the data faults are evaluated. In connection with this the fault type and the memory area in which the data fault appeared are captured. This data is statistically interpreted and gives information about the data security of the postage meter and the failure frequency of a memory area or of an electronic memory. Thereafter in step 56 the program is exited.

If in step 46 an agreement of the test sum PSA' and PSA is determined, then a branch is made to step 58. Here it is determined that fault type 2 is present, as defined for example in Table 2. In the following step 60 the fault free data A are stored in the memory areas b, c, d as new data Bn, Cn and Dn. From these data Bn, Cn, Dn corresponding test sums PSBn, PSCn and PSDn are formed, which are used in a repeat of the data examination as the final test sums PSB, PSC and PSD. Finally, proceeding through step 54 the program is ended in step 56.

Figure 2A:
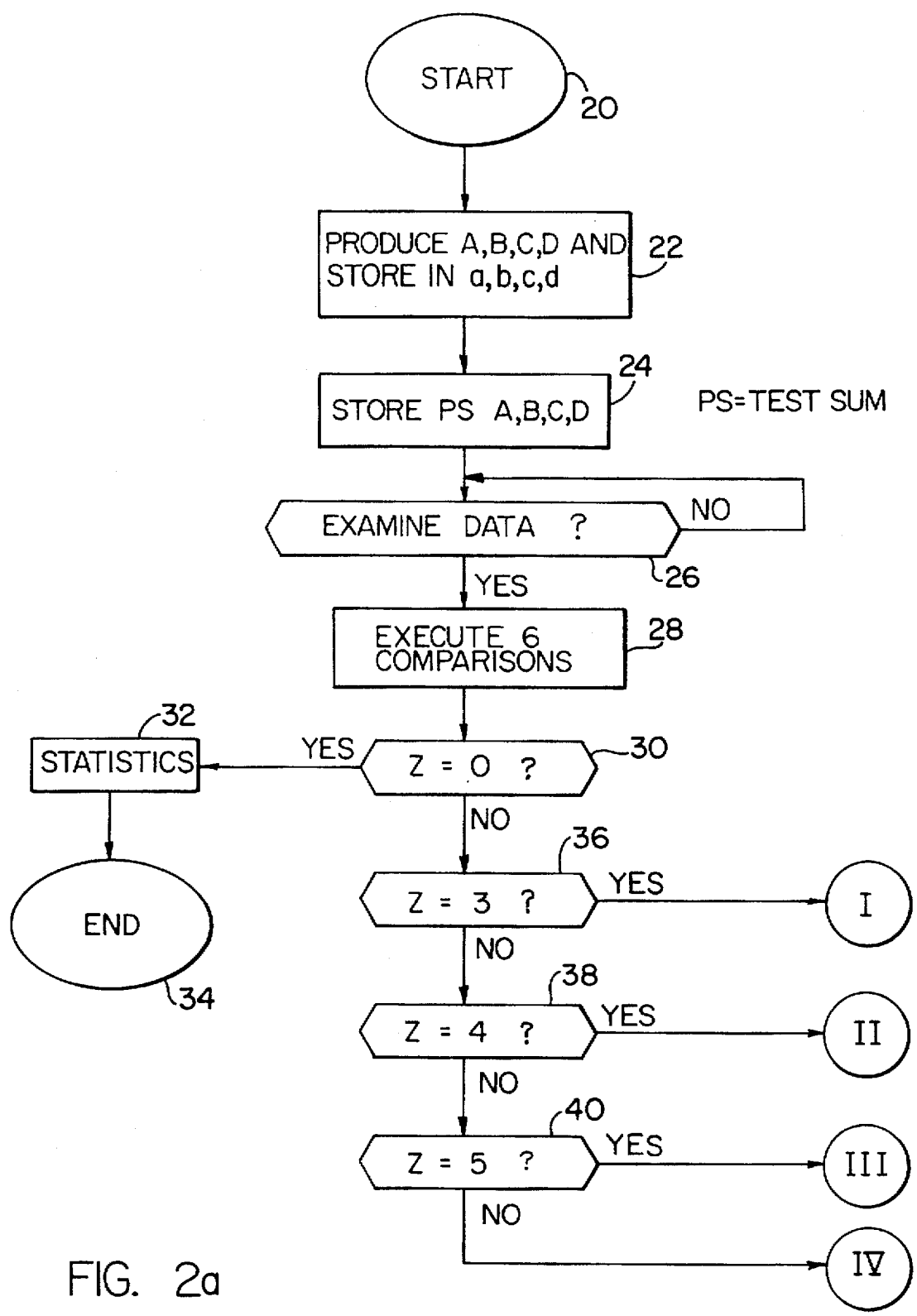
Figure 2B:
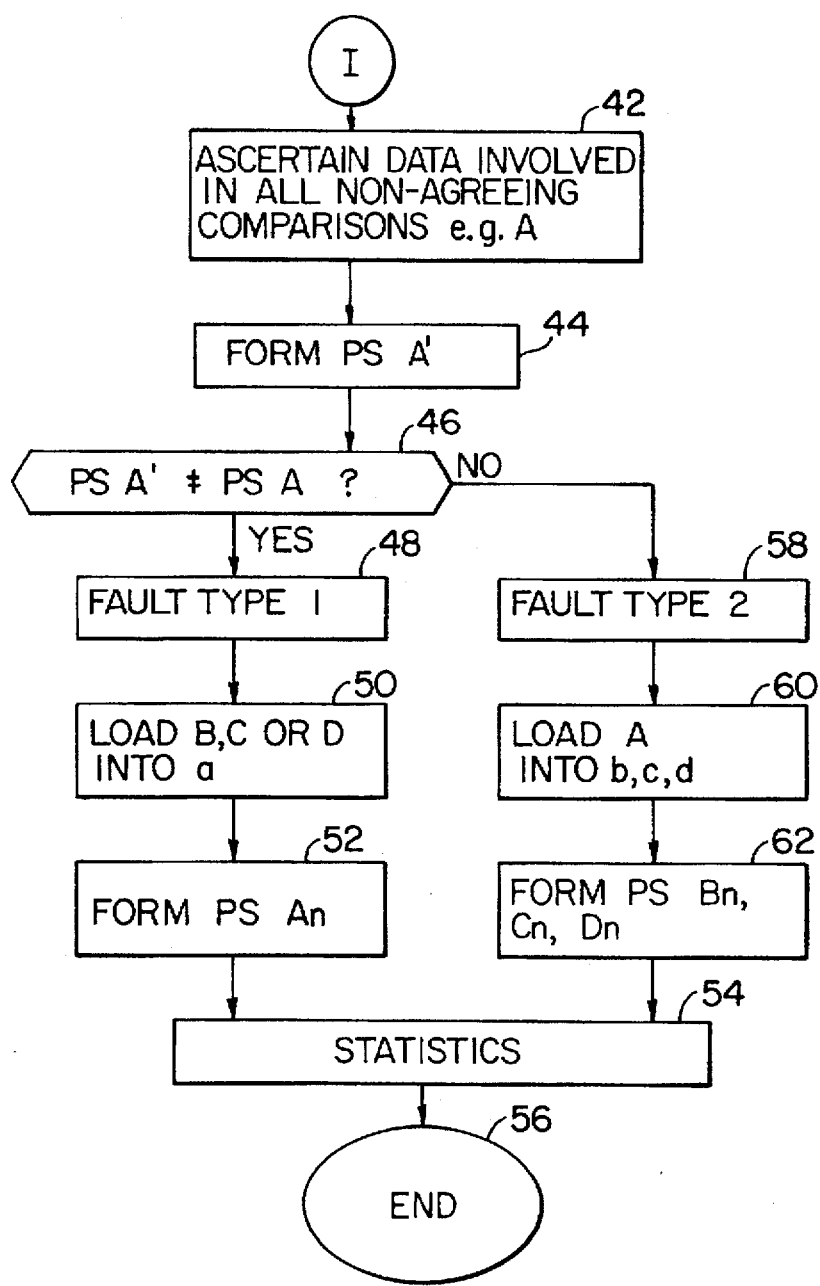
Figure 2C:
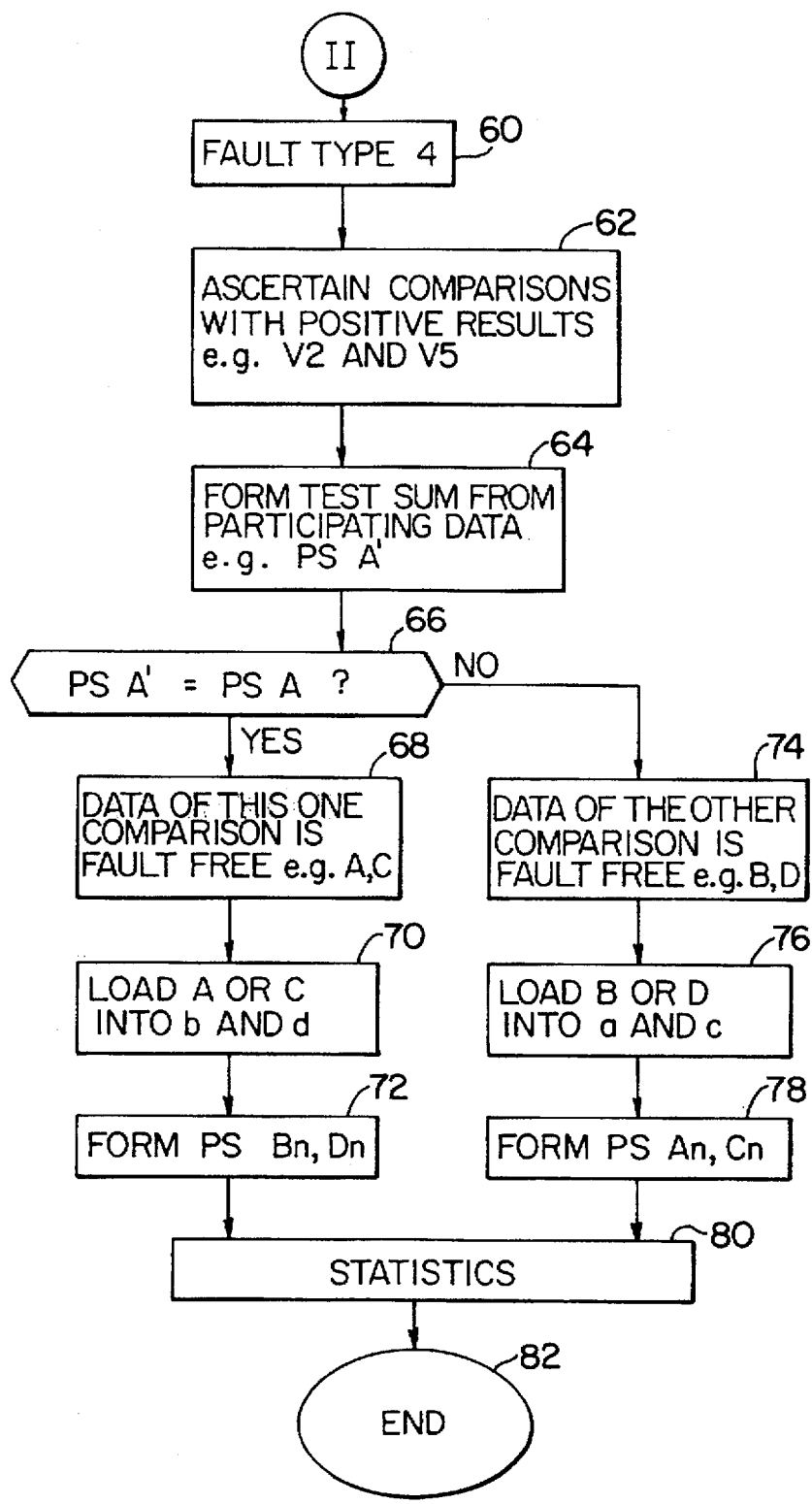

The method steps of program Section II are illustrated in FIG. 2c. This program section is used if the fault number is Z=4, that is fault type 4 is present (step 60). In step 62 it is determined which comparisons V1 to V6 have positive results. In the chosen example (see Table 4) the second and fifth comparisons V2, V5 have positive results, that is the data A and C as well as the data B and D agree with one another. Now in step 64 from the comparisons V2, V5 with positive results a memory area is chosen, for example the memory area a, and from the associated actual data, a second test sum PSA' is formed. In the following step 66 a test is made as to whether the second test sum PSA' agrees with the first test sum PSA. If this is the case, in step 68 it is determined that the data which have taken part in the second comparison V2 are fault free. In the given example these are the data A and C. In step 70 these data A or C are now loaded into the memory areas b and d having the fault containing data B and D, so that henceforth in these memory areas fault free new data Bn, Dn are contained. Upon the storing of the data A or C into the memory areas b and d or before such storage the test sums PSBn, PSDn are formed from the new data Bn and Dn and are also stored in the associated memory areas b and d. These test sums PSBn, PSDn are used in subsequent data examinations as the first test sums PSB, PSD. In the following step 80 the determined faults are statistically evaluated and finally in step 82 the program is ended.

In the event in examination step 66 the test sums PSA' and PSA compared with one another do not agree, in the following step 74 it is established that the data of the other comparison (comparison V5) with positive results are fault free, that is the data B and D. These data B or D are loaded in step 76 into the memory areas a and c and in method step 78 the test sums PSAn and PSCn are formed from the new data An, Cn. Finally through steps 80 and 82 the program is ended.

Figure 2D:
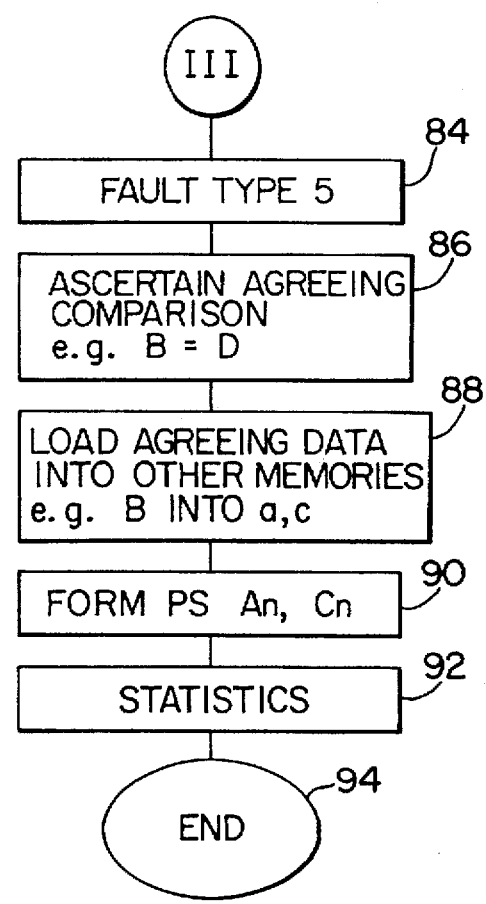

Program Section III illustrated in FIG. 2d is branched to if the fault number is Z=5. Accordingly the fault type 5 (see Table 5) is present, as is determined in step 84. In the following step 86 a recognition is made of which comparison produced the agreement of the data. In the chosen example this is the comparison V5 with involved data B and D. Accordingly in step 88 the fault free data B or D is loaded into the other memory areas a and c. In step 90 the test sums PSAn and PSCn are formed from the new data An and Cn, which upon renewed carrying out of the method in accordance with this exemplary embodiment are used as first test sums PSA, PSC. Then after passing through step 92 with its statistical evaluation of the faults the program is exited in step 94.

Figure 2E:
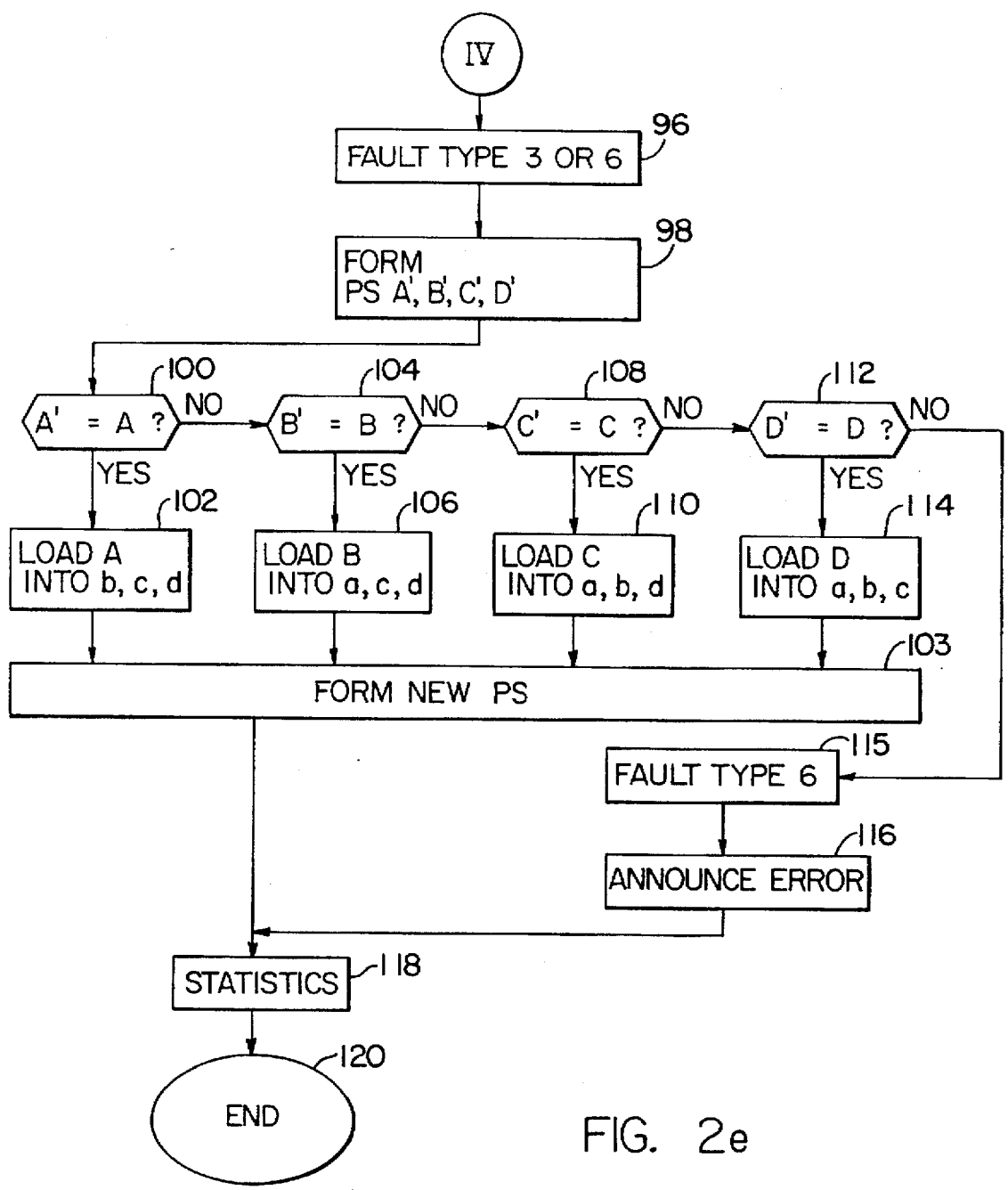

The program Section V illustrated in FIG. 2e is used in the case of a fault number Z=6. This fault number Z is associated with fault type 3 or 6 (see Tables 3 and 6), as is given in step 96. In the following step 98 second test sums PSA' to PSD' are formed from the actual data A to D. In the following examination steps 100, 104, 108 and 112 it is determined for which data A to D the first test sums PSA to PSD agree with the second test sums PSA' to PSD'. Upon agreement a branch is made to the following step, that is to step 102, 106, 110 or 114, and the fault free data are loaded into the other memory areas, as is given in the forementioned method steps 102, 106, 110 and 114. Thereafter in step 103 the first test sum is formed from the newly stored data and thereafter following step 118, in which the faults are statistically evaluated, in step 120 the program is exited.

If in step 112 it is determined that none of the first test sums PSA to PSD agree with the corresponding second proof sums PSA' to PSD', then the fault type 6 is present (step 115), that is all the data A to D have different faults. Correction of the data A to D is then not possible. Therefore in method step 116 a fault signal is created which indicates that the security relevant data A to D in the postage meter are faulty.

The exemplary embodiment described in connection with FIGS. 2a to 2e concerns the partially complex fault types 1 to 6. In practice fault type 1 appears most often, that is only one memory area has a data fault; the data in the other memory areas being fault free. For this case, which is most meaningful in practice, a simplified example of the invention is described with reference to the flow diagram illustrated in FIG. 3, in which no fault number Z is produced and a test sum comparison is not carried out. For these reasons a corresponding program can be made very simple and can be executed more quickly.

Figure 3:
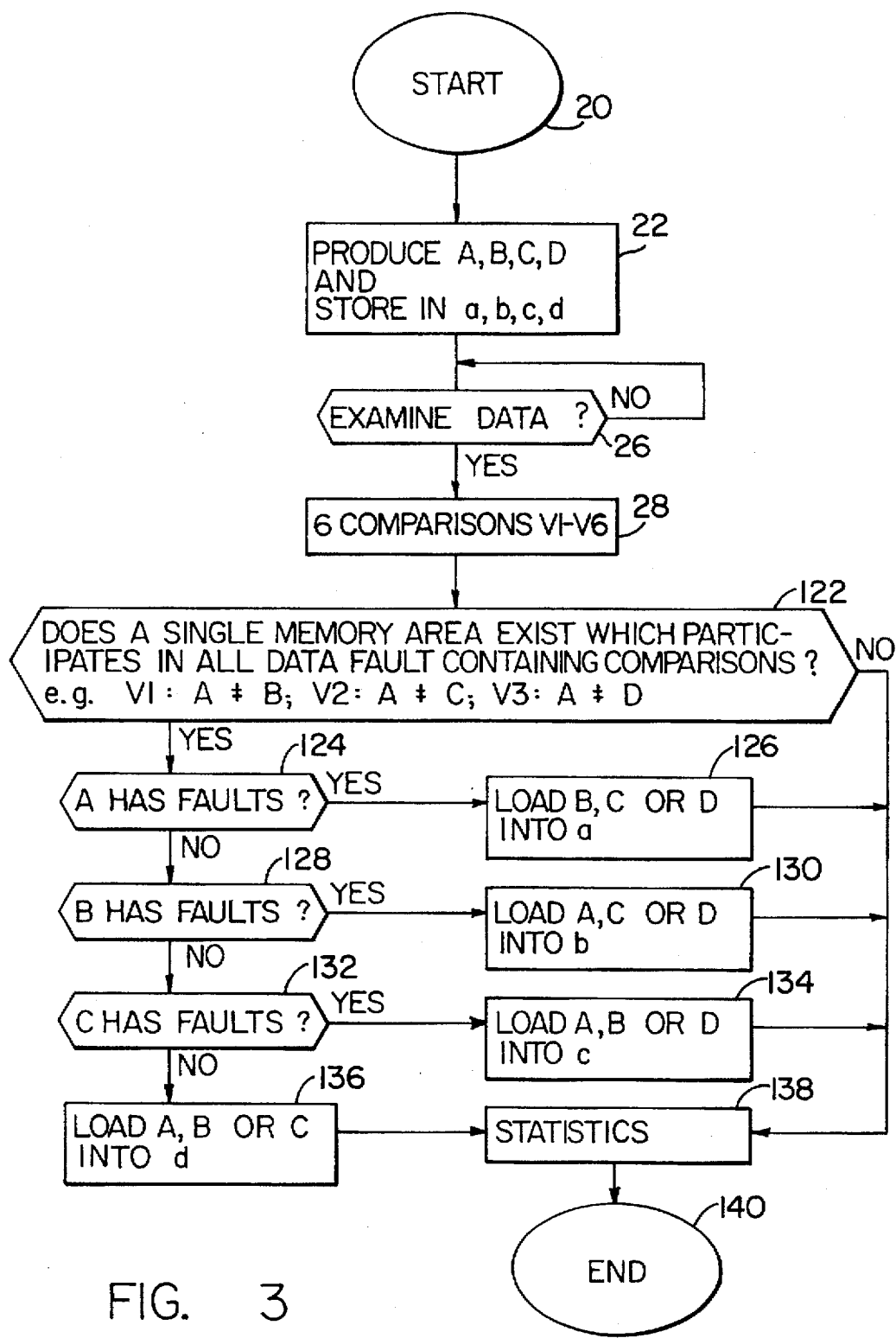
FIG. 3 is a flow diagram of a simple exemplary embodiment in which no count of faults is provided and no test sum comparison is carried out.

The method steps 20 to 28 illustrated in FIG. 3 agree in their sequence with those explained in the embodiment of FIG. 2a, with the exception that the described ascertainment of test sums via the data A, B, C, D and their storage is omitted (method step 24 in FIG. 2a). After the carrying out of the six comparisons V1 to V6 in step 122 a test is made of whether a memory area a, b, c, d exists which takes part in all comparisons showing lack of agreement. If this is not the case, then a branch is made to step 138 in which this operating condition is statistically evaluated and then the program is subsequently exited in step 140.

If such a memory area exists, for example, if in agreement with Table 1 the data A are faulty, then next a branch is made to step 124. In this step it is determined that the data A are concerned and in the subsequent step 126 in due order the data B, C or D is located into the memory area a. If data B (method steps 128 and 130), data C (method steps 132 and 134) or data D (method step 136) are concerned the procedure is carried out in an analogous way and the data is replaced by accurate data. After the replacement of the data (method step 126, 130, 134, 136) the determined fault is statistically evaluated in method step 138 and the program is ended in method step 140.

A further exemplary embodiment is sketched in FIG. 4 and essentially agrees with the previously described embodiments of FIGS. 1 and 2. In difference to the previous embodiments however only four comparisons V1, V2, V5, V6 are carried out between the data A, B, C and D, that is the comparisons V3 and V4 sketched in FIG. 1 are omitted. Accordingly the fault number for the different fault types 1 to 6 given in Tables 1 to 6 (it becomes henceforth the fault number Z') and the method steps dependent thereon change, the basic principal of realizing the fault type and the correction of the data faults being retained. In the exemplary embodiment shown in FIG. 4 the examination of the correctness of the stored data can be carried out very quickly because of the reduced number of comparisons. This embodiment therefore is useful for time critical applications.

The method steps for realizing the type of fault and the corresponding reactions are illustrated in a flow diagram in FIGS. 5a and 5b. Different sequences of the method steps correspond with those in FIGS. 2a to 2e and in FIGS. 5a and 5b are indicated by the same reference numbers. Therefore in the explanation of the following exemplary embodiment a detailed description of those method steps can be waived.

According to FIG. 5a in this exemplary embodiment the known method steps 20 to 26 are first carried out (compare FIG. 2a). In the following method step 142 the four comparisons V1, V2, V5, V6 designated in FIG. 4 are carried out and the value of the fault number Z' is ascertained. The fault numbers Z' produced in the present embodiment for the different fault types illustrated in Tables 1 to 6 are there given in parentheses. They are produced from the comparisons V1, V2, V5, V6 with faulty data, with the comparisons V3 and V4 not being taken into consideration.

If in step 144 it is determined that the fault number Z' has the value 0, after going through the method step 32 the program is exited in step 34. If the fault number has the value Z'=2, a branch is made to program section V, which is explained further below in connection with FIG. 5b.

In the case of fault number Z'=3 (method step 148) a branch is made to the method steps which are given in program section III of FIG. 2d. The fault type 5 is present, as is defined in Table 5. After the running of the already described program steps 84 to 94 the program is exited.

In case of the maximum fault number Z'=4 a branch is made through method step 148 to program section IV, whose method steps are illustrated in FIG. 2e and which treats with fault type 3 or 6 (see Tables 3 and 6).

In the following the method steps given in FIG. 5b are described in a case of a fault number Z'=2. In the case of this fault number Z' either the fault type 1 or the fault type 4 can be present (method step 150). These fault types are defined in Tables 1 and 4. First the method steps 62, 64 and 66 which are also used in program section II (FIG. 2c) are carried out. In method steps 66 and 152 it is decided whether the fault type 1 or the fault type 4 is present. If fault type 4 is being handled, that is the data of two memory areas are faulty, with each containing the same faults, the method steps 68 to 72 or the method steps 74 to 78 known from program section II (FIG. 2c) are carried out and the data faults are corrected.

If in step 152 it is ascertained that the test sums PSC' and PSC in the chosen example agree with one another, the fault type 1 is present, that is the data of a single one of the memory areas is faulty. For the removal of this fault method steps 48 to 52 known from program section I (FIG. 2b) are carried out. At the end of the procedure a statistical evaluation is taken in step 80 and the program is exited through method step 82.

TABLE 1

Fault Type 1

| Example: | Data A in memory a are faulty |
| | Data B, C, D in memories b, c, d are fault free |

TABLE 1-continued

Fault Type 1

| Comparison Results: | |
| | V1: A ≠ B |
| | V2: B ≠ C |
| | V3: A ≠ D |
| | V4: B = C |
| | V5: B = D |
| | V6: C = D |
| Fault Number | Z = 3  (Z' = 2) |

TABLE 2

Fault Type 2

| Example: | Data B, C, D have the same faults |
| | Data A are fault free |
| Comparison Results: | |
| | V1: A ≠ B |
| | V2: B ≠ C |
| | V3: A ≠ D |
| | V4: B = C |
| | V5: B = D |
| | V6: C = D |
| Fault Number | Z = 3  (Z' = 2) |

TABLE 3

Fault Type 3

| Example: | Data B, C, D have different faults |
| | Data A are fault free |
| Comparison Results: | |
| | V1: A ≠ B |
| | V2: A ≠ C |
| | V3: A ≠ D |
| | V4: B ≠ C |
| | V5: B ≠ D |
| | V6: C ≠ D |
| Fault Number | Z = 6  (Z' = 4) |

TABLE 4

Fault Type 4

| Example: | Data A, C have the same faults |
| | Data B, D are fault free |
| Comparison Results: | |
| | V1: A ≠ B |
| | V2: A = C |
| | V3: A ≠ D |
| | V4: B ≠ C |
| | V5: B = D |
| | V6: C ≠ D |
| Fault Number | Z = 4 (Z' = 2) |

TABLE 5

Fault Type 5

| Example: | Data A, C have different faults |
| | Data B, D are fault free |
| Comparison Results: | |
| | V1: A ≠ B |
| | V2: A ≠ C |

TABLE 5-continued

| | Fault Type 5 | |
|---|---|---|
| | V3: A ≠ D | |
| | V4: B ≠ C | |
| | V5: B = D | |
| | V6: C ≠ D | |
| Fault Number | Z = 5 | (Z' = 3) |

TABLE 6

| | Fault Type 6 | |
|---|---|---|
| Example: Comparison Results: | All Data A to D have different faults | |
| | V1: A ≠ B | |
| | V2: A ≠ C | |
| | V3: A ≠ D | |
| | V4: B ≠ C | |
| | V5: B ≠ D | |
| | V6: C ≠ D | |
| Fault Number | Z = 6 | (Z' = 4) |

We claim:

1. A method for storing security relevant data in a postage meter, in which method data (A, B, C, D) are stored in several memory areas (a, b, c, d), the data (A, B, C, D) are read out of the memory areas (a, b, c, d) and the data of one memory area is compared with the data of another memory area, and in which a memory area with faulty data is ascertained, if such memory area with faulty data exists, said method comprising the steps of:

storing the same data (A, B, C, D) in at least four memory areas (a, b, c, d), making comparisons to compare the data (A, B, C, D) of each memory area (a, b, c, d) with the data (A, B, C, D) of the other memory areas (a, b, c, d) and to produce results indicating for each comparison whether the data compared is in agreement or not in agreement, ascertaining a fault number (Z) which fault number (Z) indicates in how many of said comparisons lack of agreement is found between the compared data, and processing the results of said comparisons and said fault number (Z) to determine the memory area or memory areas (a, b, c, d) with fault containing data (A, B, C, D).

2. The method according to claim 1, wherein in said step of storing the same data (A, B, C, D) in at least four memory areas (a, b, c, d) in at least two of said memory areas the data are stored in inverted form and that in the remainder of said memory areas the data are stored in non-inverted form, and in said step of making comparisons when said non-inverted data is compared to said inverted data said inverted data is negated.

3. The method according to claim 1, wherein in said step of making comparisons said comparisons take place through an exclusive OR logic operation.

4. The method according to claim 1, wherein in said step of making comparisons said comparisons are carried out byte wise with bit alignment.

5. The method according to claim 1, and including the further steps of, before or upon said step of storing the same data (A, B, C, D) in the memory areas (a, b, c, d), forming and storing first test sums (PSA to PSD) from the data (A, B, C, D) of each memory area (a, b, c, d), upon or following said step of making said comparisons forming second test sums (PSA' to PSD') from the data (A, B. C, D) then in said memory areas, and comparing said second test sums (PSA' to PSD') respectively to said first test sums (PSA to PSD), and including the results of said comparisons of said second test sums with said first test sums in said processing step for determining the memory area or areas with fault containing data.

6. The method according to claim 5, wherein with four memory areas (a, b, c, d) four comparisons (V1, V2, V5, V6) of the data (A, B, C, D) and of the test sums (PSA to PSD; PSA' to PSD') are carried out.

7. The method according to claim 5, wherein with four memory areas (a, b, c, d) six comparisons (V1 to V6) of the data (A, B, C, D) and of the test sums (PSA to PSD; PSA' to PSD') are carried out.

8. The method according to claim 7, wherein if said fault number (Z) is ascertained to be 3 that memory area (a) is ascertained which in three of the comparisons (V1, V2, V3) faulty data is shown, that the first and second test sums (PSA, PSA') of this memory area (a) are compared with one another, and that this memory area (a) is loaded with data (B) or inverted data from one of the other memory areas (b), if in said comparison of said first and second test sums (PSA, PSA') no agreement is ascertained.

9. The method according to claim 7, wherein if said fault number (Z) is ascertained to be 3 that memory area (a) is ascertained which shows faulty data in three comparisons (V1, V2, V3), that the first and second test sums (PSA, PSA') of this memory area (a) are compared with one another, and that the data (A) of this memory area (a) is stored in the other memory areas (b, c, d) if in said comparison of said first and second test sums (PSA, PSA') agreement is ascertained.

10. The method according to claim 7, wherein if said fault member (Z) is ascertained to be 4 those memory areas (a, c; b, d) are ascertained whose comparisons (V2, V5) of the data (A, B, C, D) show data agreement, from said memory areas showing data agreement those memory areas (a, c; b, d) without faulty data are ascertained by a test sum comparison, and that data (A or C; B or D) of one of said memory areas without faulty data (a, c; b, d) is stored in the fault containing memory area (b, d; a, c).

11. The method according to claim 7, wherein if said fault number (Z) is ascertained to be 5 those memory areas (b, d) with agreement of data (B, D) are ascertained, and that the data (B or D) of one of these memory areas (b, d) is loaded into the other memory area (a, c).

12. The method according to claim 7, wherein if said fault number (Z) is ascertained to be 6 for each memory area (a, b, c, d) a test sum comparison (100, 104, 108, 112) is carried out, and that the data of the memory area with positive comparison results (102, 106, 110, 114) is loaded into the other areas of said memory areas.

13. The method according to claim 12, wherein in the case of all of said test sum comparisons showing a lack of agreement a fault signal (116) is produced which indicates that the fault cannot be corrected.

14. The method according to claim 5, wherein from the data to be stored in a memory area (a, b, c, d) previously containing faulty data a first test sum (PSAn to PSDn) is newly formed and stored.

15. The method according to claim 1, wherein over a predetermined time interval the faults appearing in each memory area (a, b, c, d) are ascertained and indicated.

16. The method according to claim 1, wherein said steps are automatically repeated at intermittent times.

17. The method according to claim 1, wherein the data (A, B, C, D) are stored in electronic memories (10, 12) physically separate from one another.

18. The method according to claim 1, wherein with four memory areas (a, b, c, d) four comparisons (V1, V2, V5, V6) of the data (A, B, C, D) are carried out.

19. The method according to claim 1, wherein with four memory areas (a, b, c, d) six comparisons (V1 to V6) of the data (A, B, C, D) are carried out.

20. The method according to claim 1, and which method includes the further steps of, after said memory area or memory areas (a, b, c, d) with fault containing data (A, B, C, D) are determined as a result of said processing step, reloading said determined memory area or memory areas with data (A, B, C, D) from a memory area (a, b, c, d) other than any one of said determined memory area or memory areas.

* * * * *